(12) United States Patent
Sharma (10) Patent No.: US 9,748,345 B2
(45) Date of Patent: Aug. 29, 2017

(54) MODIFICATION OF ELECTRICAL PROPERTIES OF TOPOLOGICAL INSULATORS

(71) Applicant: Sandia Corporation, Albuquerque, NM (US)

(72) Inventor: Peter Anand Sharma, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/177,215

(22) Filed: Jun. 8, 2016

(65) Prior Publication Data

US 2016/0365255 A1    Dec. 15, 2016

Related U.S. Application Data

(60) Provisional application No. 62/175,543, filed on Jun. 15, 2015.

(51) Int. Cl.
| | |
|---|---|
| *H01L 29/24* | (2006.01) |
| *H01L 21/477* | (2006.01) |
| *H01L 21/385* | (2006.01) |
| *H01L 43/14* | (2006.01) |
| *H01L 43/10* | (2006.01) |
| *H01L 21/426* | (2006.01) |

(52) U.S. Cl.
CPC ............ *H01L 29/24* (2013.01); *H01L 21/385* (2013.01); *H01L 21/426* (2013.01); *H01L 21/477* (2013.01); *H01L 43/10* (2013.01); *H01L 43/14* (2013.01)

(58) Field of Classification Search
CPC combination set(s) only.
See application file for complete search history.

(56) References Cited

U.S. PATENT DOCUMENTS

2016/0104791 A1*    4/2016    Morvan ............ H01L 29/66462
                                                          438/168

OTHER PUBLICATIONS

Choi; Simple Tuning of carrier type in topological insulator Bi2Se3 by Mn doping, Oct. 9, 2012, Applied Physics Letters 101.*
Ando, Y., "Topological Insulator Materials", Journal of the Physical Society of Japan 82 (2013), pp. 102001-1-102001-32.
Gao, H. et al., "Structural and electronic properties of highly doped topological insulator Bi2Se3 crystals", Phys. Status Solidi RRL 7, No. 1-2 (2013), pp. 133-135.
Hasan, M.Z. et al., "Colloquium: Topological insulators", Reviews of Modern Physics, vol. 82 (2010), pp. 3045-3067.

(Continued)

*Primary Examiner* — Kyoung Lee
*Assistant Examiner* — Ratisha Mehta
(74) *Attorney, Agent, or Firm* — Kevin W. Bieg (57) ABSTRACT

Ion implantation or deposition can be used to modify the bulk electrical properties of topological insulators. More particularly, ion implantation or deposition can be used to compensate for the non-zero bulk conductivity due to extrinsic charge carriers. The direct implantation of deposition/annealing of dopants allows better control over carrier concentrations for the purposes of achieving low bulk conductivity. Ion implantation or deposition enables the fabrication of inhomogeneously doped structures, enabling new types of device designs.

12 Claims, 7 Drawing Sheets

(56) References Cited

OTHER PUBLICATIONS

He, L. et al., "Review of 3D topological insulator thin-film growth by molecular beam epitaxy and potential applications", Phys. Status Solidi RRL 7, No. 1-2 (2013), pp. 50-63.

Hor, Y.S. et al., "p-type Bi2Se3 for topological insulator and low-temperature thermoelectric applications", Physical Review B 79 (2009), pp. 195208-1-195208-5.

Sharma, P.A. et al., "Ion beam modification of topological insulator bismuth selenide", Applied Physics Letters 105 2014), pp. 242106-1-242106-4.

* cited by examiner

MODIFICATION OF ELECTRICAL PROPERTIES OF TOPOLOGICAL INSULATORS

CROSS-REFERENCE TO RELATED APPLICATION

This application claims the benefit of U.S. Provisional Application No. 62/175,543, filed Jun. 15, 2015, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to the fabrication of electric device structures made from topological insulators and, in particular, a method of modifying the electrical properties of topological insulators using ion irradiation or deposition of dopant atoms.

BACKGROUND OF THE INVENTION

A topological insulator is a material that behaves as an insulator in its bulk but whose surface contains conducting states, meaning that electrons can only move along the surface of the material. On the surface of a topological insulator there are special surface electronic states that fall within the bulk energy gap and allow surface metallic conduction. Carriers in these surface states have their spin locked perpendicularly to their momentum. Therefore, at a given energy the only other available electronic states have a different spin, so that backscattering is strongly suppressed and carrier conduction on the surface occurs with high mobility, in a similar way to edge currents in a two-dimensional electron gas. The spin orientation is caused by an interaction between the electron's motion and its spin (spin-orbit coupling), and is unique to topological insulators. This spin-orbit interaction plays a role in certain compounds and alloys composed of heavy elements, such as bismuth or antimony. Therefore, three-dimensional topological insulation has been observed most often in semimetals and semimetal chalcogenides, such as antimony, bismuth antimonide, bismuth selenide, bismuth telluride, antimony telluride, bismuth tellurium selenide, bismuth antimony tellurium selenide, thallium bismuth selenide, lead bismuth telluride, and compounds and alloys thereof. A complete listing of materials that have been experimentally verified to display topological insulating properties as of May 2013 is given in Y. Ando, *J. Phys. Soc. Jap.* 82, 102001 (2013), which is incorporated herein by reference.

Three-dimensional topological insulators are usually described as supporting polarized spin transport at their surfaces with a spin density proportional to the current density. See Dimitrie Culcer et al., *Physical Review B* 82(15), 155457 (2010). As a result, devices with tunable control of spin polarized currents might be realized, which would be useful for spintronics applications. See Dmytro Pesin and Allan H. MacDonald, *Nat. Mater.* 11(5), 409 (2012). According to the definition of a topological insulator, transport only occurs at surfaces. Experiments showing evidence of surface transport have all conducted on homogeneous crystals or thin films. A major problem with many of these materials is the significant amount of bulk conduction, even at low temperatures. See Helin Cao et al., *physica status solidi (RRL)—Rapid Research Letters* 7(1-2), 133 (2013). Such parasitic bulk conduction makes it difficult to isolate surface transport phenomena and is a barrier to applications of topological insulator surface currents.

One of the most widely studied topological insulators, $Bi_2Se_3$, illustrates the difficulty of achieving low bulk conductivity. The carrier concentration and transport properties of $Bi_2Se_3$ strongly depend on the Se partial pressure during synthesis. See H. Gobrecht et al., *Zeitschrift für Physik* 177(1), 68 (1964); and J. Horák et al., *Journal of Physics and Chemistry of Solids* 51(12), 1353 (1990). For this reason, Se vacancies, which act as double donors, are assumed to explain the large native n-type carrier concentrations in $Bi_2Se_3$. A common approach to counteract the presence of Se vacancies in $Bi_2Se_3$ is to use compensation doping or anneal materials in the presence of Se vapor during crystal or thin film growth. See J. Kasparova et al., *Journal of Applied Physics* 97(10), 103720 (2005); and Y. S. Hor et al., *Physical Review B* 79(19), 195208 (2009). Using compensation doping to effectively eliminate extrinsic conduction requires careful control over p-type dopant concentrations. The lowest carrier concentrations achieved with compensation doping in conventional bulk and thin film synthesis techniques is $\sim 10^{16}$ cm$^{-3}$, resulting in a relatively high bulk conductivity of $\sim 100$ $1/\Omega2$ cm. See N. P. Butch et al., *Physical Review B* 81(24), 241301 (2010); and Seung Sae Hong et al., *Nat. Commun.* 3, 757 (2012).

Therefore, a need remains for a method to synthesize topological insulators having low bulk conductivity. There is also a need to selectively dope topological insulators as a function of position. Such inhomogeneous doping is a foundational capability that may enable advanced semiconductor devices made from topological insulators.

SUMMARY OF THE INVENTION

The present invention is directed to a method to modify the electrical properties of a topological insulator having finite bulk conductivity due to bulk charge carriers. The invention provides two methods for changing the electrical properties: by ion implanting the topological insulator with a dopant, followed by a short annealing step, or by deposition of dopant atoms on the surface of the topological insulator, followed by an annealing step. The dopant atoms introduced through implantation or deposition compensate for the bulk charge carriers. For example, the bulk charge carriers can comprise n-type charge carriers and the dopant can comprise a p-type dopant. Alternatively, the bulk charge carriers can comprise p-type charge carriers and the dopant can comprise an n-type dopant. An annealing step is used to electrically activate the dopant and diffuse the dopant through the topological insulator lattice. The invention can achieve a desired doping as a function of position, both laterally and as a function of depth in the topological insulator. The topological insulator can be one of the currently known materials described by Y. Ando, supra. For example, the topological insulator can comprise a semimetal or semimetal alloy, such as bismuth, antimony, lead, tin, germanium, thallium, or bismuth antimonide. The topological insulator can be a chalcogenide comprising selenium, tellurium, or sulfur. For example, the topological insulator can comprise a bismuth chalcogenide or an antimony chalcogenide, such as bismuth selenide, bismuth telluride, antimony telluride, or bismuth antimony tellurium selenide. A large variety of dopants can be used. Common dopants are from Groups 1, 2, 13, 14, 15, 16, and 17 and periods 4, 5, and 6 of the periodic table. The ion implantation dose can typically be greater than $5 \times 10^{13}$ cm$^{-2}$ and less than $10^{20}$ cm$^{-2}$.

As an example of the invention, chemical doping of the topological insulator $Bi_2Se_3$ using ion implantation is described. Ion beam-induced structural damage was characterized using grazing incidence X-ray diffraction and transmission electron microscopy. Ion damage was reversed using a simple thermal annealing step. Carrier type conversion was achieved using ion implantation followed by an activation anneal in $Bi_2Se_3$ thin films. These results establish that ion implantation can be used for chemical modification of $Bi_2Se_3$, a prototypical topological insulator. However, ion implantation can in principle be used for any topological insulator. The direct implantation of dopants allows better control over carrier concentrations for the purposes of achieving low bulk conductivity. Ion implantation also enables the fabrication of inhomogeneously doped structures, which in turn makes possible new types of device designs.

Chemical doping of topological insulators using deposition is also described. For the deposition method, a p-type dopant was deposited on the top surface of a topological insulator. The topological insulator with the dopant film was annealed at 155° C. for 10 minutes to diffuse the dopant into the bulk material. This method was used to form a p-n junction with rectifying characteristics, indicating that the dopant successfully entered and chemically modified the topological insulator substrate.

BRIEF DESCRIPTION OF THE DRAWINGS

The detailed description will refer to the following drawings, wherein like elements are referred to by like numbers.

DETAILED DESCRIPTION OF THE INVENTION

The present invention uses ion implantation and deposition to modify the bulk or near-surface electrical properties of topological insulators. More particularly, ion implantation and deposition are used to compensate for the non-zero bulk conductivity due to extrinsic charge carriers. As examples of the invention, ion implantation was used as an alternative method for the p-type doping of $Bi_2Se_3$ and deposition was used to form a p-n junction in $Bi_2Se_3$. Although p-type $Bi_2Se_3$ has been synthesized using bulk synthesis methods, ion implantation allows more precise control over the number and spatial distribution of dopants. See Y. S. Hor et al., *Physical Review B* 79(19), 195208 (2009). This is important in the context of topological insulators for two reasons. Direct implantation of dopants enables a higher degree of control over carrier concentration in topological insulators for the purposes of achieving low bulk conductivity, beyond what has been achieved using bulk or thin film processes. This higher degree of control is possible through the control of the ion beam current. Inhomogeneously doped device structures can be fabricated in topological insulators using a combination of lithography and ion implantation. If type conversion can be achieved, planar p-n junctions can be formed. The existence of a p-n junction implies a space charge region in which there is no bulk conduction. This is an alternative method for reducing bulk conduction in topological insulators. Ion implantation has been used to fabricate integrated circuits for these reasons. See J. S. Williams, *Materials Science and Engineering*: A 253 (1-2), 8 (1998). Advanced integrated devices based on topological insulators are thus possible using ion implantation and deposition.

The feasibility of ion implantation was demonstrated through two sets of experiments. First, the extent of structural damage caused by Ca ion implantation in $Bi_2Se_3$ wafers was shown using grazing incidence X-ray diffraction (GIXRD) and transmission electron microscopy (TEM). Ion beam damage was removed using a low temperature annealing step. Second, ion implantation was used to convert native n-type $Bi_2Se_3$ films to p-type using Ca ions. An annealing step is required to activate implanted Ca ions.

Bi$_2$Se$_3$ is only used as an example material to demonstrate the invention. Ion implantation can in principle be used for charge compensation or inhomogeneous doping of any topological insulator.

Ion implantation of Ca was performed at 200 keV at nominal doses from ~$10^{13}$-$10^{17}$ cm$^{-2}$. Single-sided polished Bi$_2$Se$_3$ wafers with large ~mm sized grains were synthesized using an established melt growth procedure and directly placed in the implantation chamber and used for GIXRD and TEM measurements. See Y. S. Hor et al., *Physical Review B* 79(19), 195208 (2009). Bi$_2$Se$_3$ films, of 256 nm thickness grown on sapphire (0001) substrates via molecular beam epitaxy using a previously reported method, were first coated with 100 nm of sputtered Al$_2$O$_3$ before implantation to mitigate ion beam damage and prevent the loss of Se during annealing. See Namrata Bansal et al., *Physical Review Letters* 109(11), 116804 (2012). Films were used for assessing changes in carrier concentration with Ca implantation. SRIM simulations were performed to estimate the dopant distribution for implantation into wafers and films with an Al$_2$O$_3$ layer. See J. F. Ziegler et al., *SRIM, the stopping and range of ions in matter* (SRIM Company, 2008).

Secondary ion mass spectrometry (SIMS) was performed to validate SRIM simulations. The end of range for 200 keV Ca is ~150 nm with a straggle of ~100 nm. Implantation of Ca was chosen since this is the simplest p-type dopant in Bi$_2$Se$_3$. See Y. S. Hor et al., *Physical Review B* 79(19), 195208 (2009). Exfoliated flakes were transferred to TEM grids. Bi$_2$Se$_3$ ingot material was initially mechanically cleaved into small pieces along the basal planes. These pieces were then exfoliated using scotch tape until a very thin portion of Bi$_2$Se$_3$ was formed. The tape was pressed onto a cleaned silicon wafer with a thermally grown oxide of 90 nm. The tape was removed, which resulted in the transfer of some Bi$_2$Se$_3$ flakes. TEM grids with a flexible carbon support film were then stuck to the wafer surface by dropping isopropanol on the grids and allowing it to dry. Dilute hydrofluoric acid (3% in deionized water) was then dropped on top of the TEM grids, which etched the surface oxide of the wafer but left the TEM grids and Bi$_2$Se$_3$ flakes unaffected. The grids were released during this process and rinsed with water before TEM analysis. This method produced variable thickness Bi$_2$Se$_3$ flakes, many of which were electron transparent, with few defects. TEM grids with Bi$_2$Se$_3$ flakes were placed directly in the implanter. The same regions of specimen were characterized by TEM both before and after implantation. AC resistance measurements were used to measure the Hall resistance.

The first potential challenge involved with ion implantation is the introduction of amorphous regions due to ion damage. Topological insulator surface transport phenomena are only expected to occur in the presence of a crystalline lattice. GIXRD was used to assess the crystallinity of implanted wafers in the near surface Ca implanted region. The grazing incidence geometry allows one to examine structural variations as a function of depth by precisely controlling incident angle and therefore the penetration depth of X-rays. See J. Daillant and M. Alba, *Reports on Progress in Physics* 63(10), 1725 (2000). A PANalytical Empyrean system was used with a PIXcel3D detector using monochromatic copper Kα radiation (λ=1.5406 Å) at 45 kV and 40 mA. Detector scans were performed at various fixed grazing angles. The inter-planar spacings of the crystal structure were determined from the GIXRD measurements. The samples were placed at an appropriate angle to the source so that the X-rays exhibit grazing incidence with the surface and then the PIXcel3D detector was physically rotated through an angle of 2θ relative to the sample. The grazing incidence angle was subtracted from the data to yield intensity versus 2θ. GIXRD patterns were then interpreted as standard θ-2θ powder X-ray diffraction patterns at different penetration depths, corresponding to different grazing incident angles.

Figure 1A:
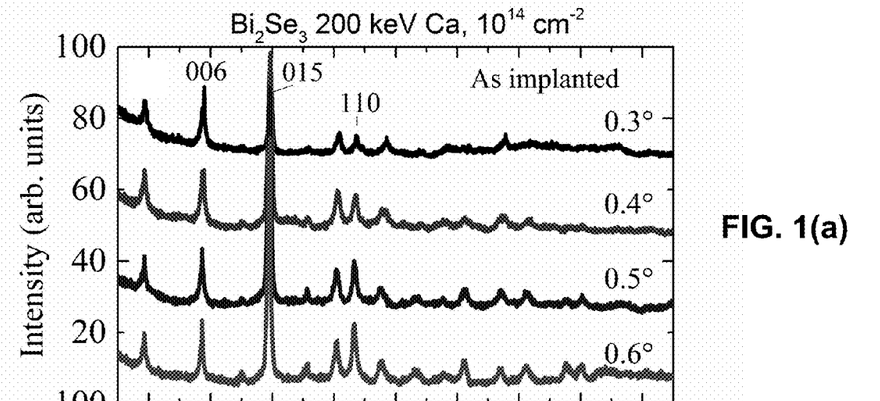
FIGS. 1(a) and 1(b) are graphs of grazing incidence X-ray diffraction (GIXRD) patterns for (a) a $Bi_2Se_3$ wafer implanted with 200 keV Ca at a dose of $8 \times 10^{14}$ cm$^{-2}$ and (b) the same wafer after annealing for 350° C. for 15 minutes. The grazing angles of 0.3, 0.4, 0.5, and 0.6 degrees correspond to approximate penetration depths of 40, 200, 350, and 400 nm, respectively. The end of range and straggle parameters for 200 keV Ca are about 150 and 100 nm, respectively. Selected peaks for $Bi_2Se_3$ are indexed.
Figure 1B:
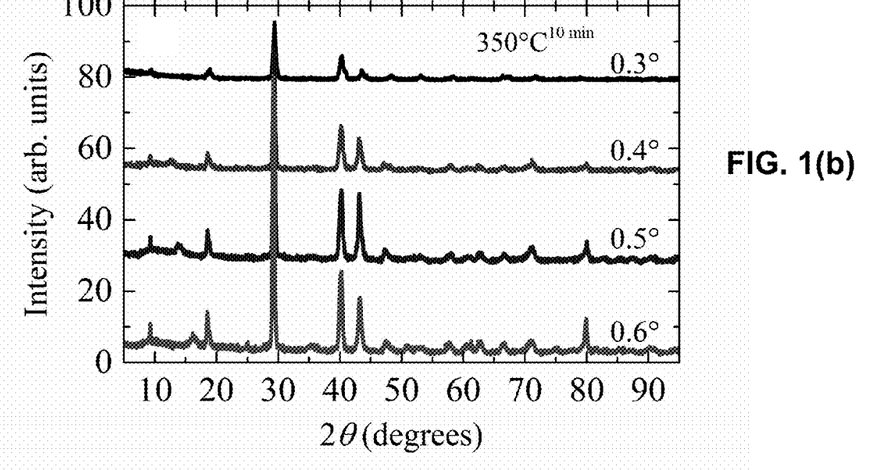
Figure 2A:
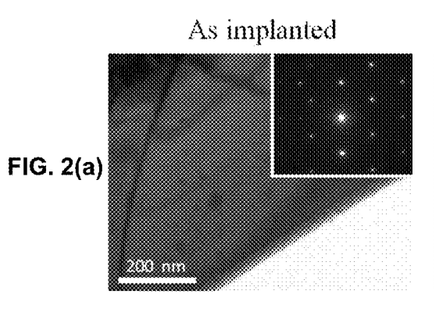
FIGS. 2(a)-(f) are representative transmission electron microscopy (TEM) micrographs of $Bi_2Se_3$ showing the effect of ion implantation at different doses. Identical regions were directly compared before (a, b, c) and after (d, e, f) implantation. Defect clusters are observed after implantation, which progressively increase with increasing dose. Within these defect cluster regions, selected area diffraction patterns (inset for each figure) indicate that the material remains highly crystalline.
Figure 2B:
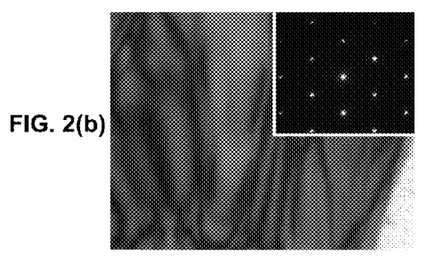
Figure 2C:
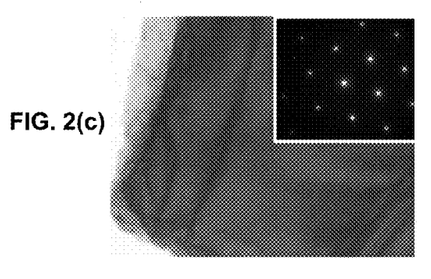
Figure 2D:
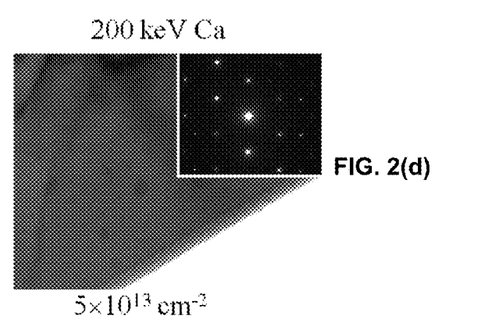
Figure 2E:
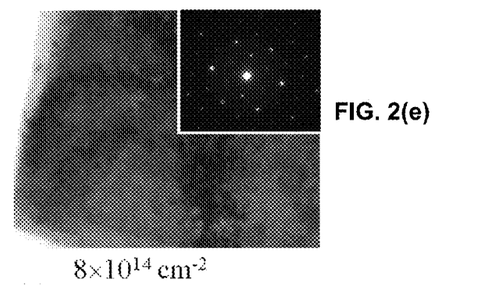
Figure 2F:
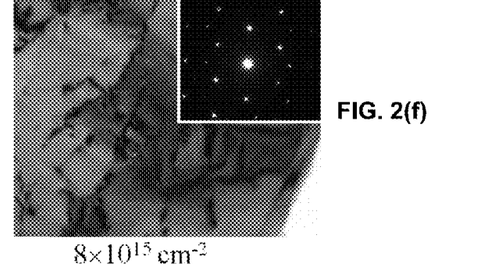

The GIXRD measurements are shown in FIG. 1(*a*) after implantation at a dose of $10^{14}$ cm$^{-2}$, and again after an annealing step in FIG. 1(*b*). The peaks in FIGS. 1(*a*) and 1(*b*) are all indexed to Bi$_2$Se$_3$, with no impurity phases within the resolution of X-ray diffraction. The grazing angles of 0.3, 0.4, 0.5, and 0.6° correspond to penetration depths of ~40, 200, 350, and 400 nm, respectively. These penetration depths were estimated based on those for GaAs and should be considered an upper bound due to the higher density (corresponding to a smaller penetration depth at a given grazing angle) of Bi$_2$Se$_3$ compared to GaAs. See S. Stepanov, in *3rd Autumn School on X-ray Scattering from Surfaces and Thin Layers* (Smolence, Slovakia, 1997). The signature of amorphous regions is the presence of a broad low angle peak in the θ-2θ pattern and the absence of diffraction peaks at higher angles. At this dose peak broadening is observed, but all peaks are clearly visible. Annealing at 350° C. for 15 minutes reduces the peak broadening in the as implanted diffraction pattern. Diffraction patterns were collected for the as prepared samples (not shown) and compared well with the annealed, implanted patterns. For a dose of $10^{17}$ cm$^{-2}$, similar behavior was observed, but with a systematically higher degree of peak broadening. Annealing at 350° C. for 15 minutes in vacuum always reversed peak broadening and the GIXRD pattern became very similar to the as prepared pattern. Peak broadening was largest for penetration depths of up to 200 nm, which encompasses most of the implanted ions as judged from SIMS measurements and SRIM simulations. Note there are minor differences in peak intensities in patterns collected on different samples or different positions on the same sample. No low angle amorphous peak appears in any diffraction pattern for any dose studied (up to $10^{17}$ cm$^{-2}$). Since the annealing temperature of 350° C. was below ⅔ of the melting temperature (~700° C.), recrystallization is not expected to occur, which along with the lack of a broad low angle peak, suggests that peak broadening is not due to amorphization but damage of some kind.

TEM experiments were conducted in order to assess ion damage and the possible presence of structural damage below the spatial resolution of X-ray diffraction. FIGS. 2(*a*)-(*e*) show a series of bright field TEM micrographs of exfoliated Bi$_2$Se$_3$ flakes on a carbon grid. Images were collected under bright-field conditions with a small objective aperture placed around the forwardly scattered beam with the samples oriented near the [0001] zone. The same area was imaged before and after implantation for the samples shown. For the non-irradiated samples, the contrast is consistent within the samples other than places where dislocation lines are visible (FIGS. 2(*a*) and 2(*c*)) or where bend contours are observed (e.g., in FIG. 2(*b*)). All samples exhibit high crystallinity as indicated by the diffraction patterns.

For the irradiated samples shown in FIGS. 2(*d*)-(*e*), different doses result in different amounts of damage being imparted upon the samples. At the lowest dose of 5×$10^{13}$ cm$^{-2}$, no obvious differences in contrast are seen in comparison to the as prepared sample. For the higher doses, some form of damage is evident throughout the samples. At 8×$10^{14}$ cm$^{-2}$, isolated defects disrupt the bend contours observed in non-irradiated samples. These defects are identified as dark regions in FIG. 2(e). While the type of defect was not confirmed, one possibility is that these dark regions correspond to dislocation loops. At $8\times10^{15}$ cm$^{-2}$ doses, the defect density increases so that individual defects are not observable, and the sample exhibits significant contrast variation throughout. Despite the appearance of these defects, the irradiated samples still show a high degree of crystallinity as shown by the electron diffraction patterns in the inset of each image. The large dark regions at $8\times10^{15}$ cm$^{-2}$ are then probably an agglomeration of defects. Thus, at the highest doses shown here, the diffraction patterns indicate that the material has retained its long-range crystalline order. It is still possible that the material may become amorphous at much higher doses. On a larger scale, the GIXRD results show that doses as high as $\sim10^{17}$ cm$^{-2}$ do not result in amorphization.

Figure 3:
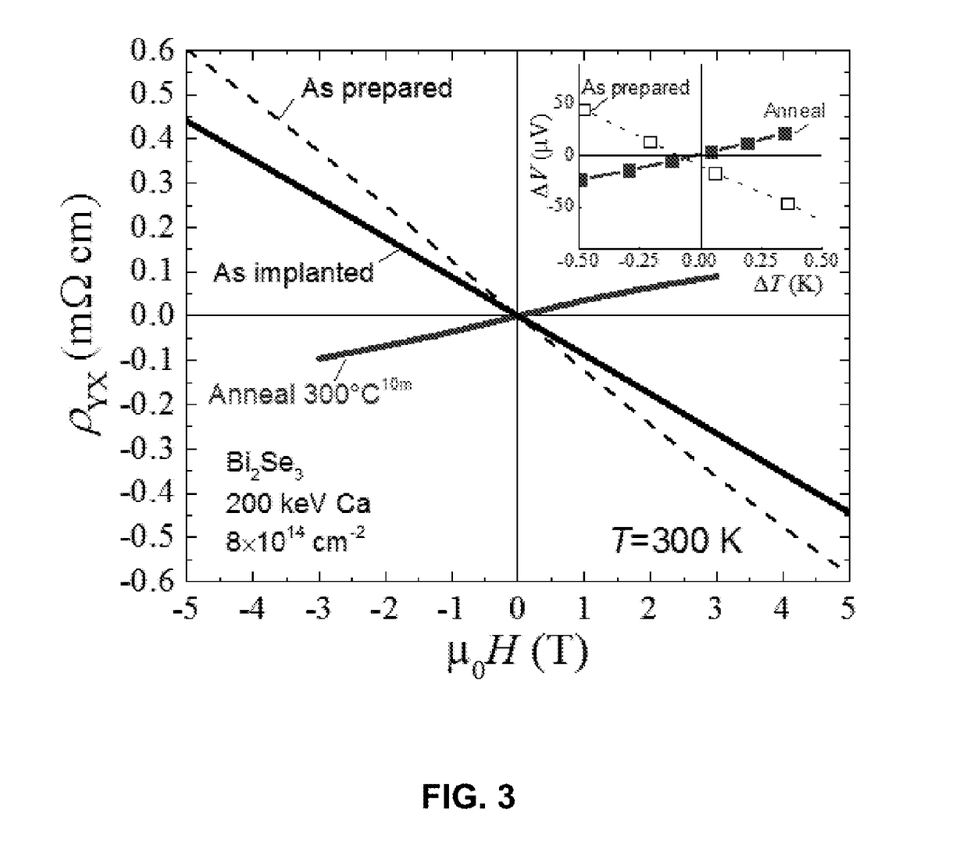
FIG. 3 is a graph of Hall resistivity ($\rho YX$) as a function of magnetic field (H) at room temperature for an as prepared $Bi_2Se_3$ film (dashed line), a film directly after 200 keV Ca implantation at a dose of $8 \times 10^{14}$ cm$^{-2}$ (dark line), and the same film after a 300° C., 10 minute anneal (light line). The annealed film is clearly p-type. Inset: Seebeck voltage ($\Delta V$) versus temperature gradient ($\Delta T$) for the same film shown in the main panel. The annealed, implanted film has a positive Seebeck coefficient, confirming the Hall effect data in the main panel.

In the second set of experiments, it was demonstrated that ion implantation can be used to introduce charge carriers into Bi$_2$Se$_3$. Thin films with thickness of 256 nm were used to measure the sign and concentration of charge carriers after ion implantation. Implantation of Ca ions followed by a low temperature annealing step converted native n-type Bi$_2$Se$_3$ films (carrier concentration $\sim10^{18}$ cm$^{-3}$) into p-type at a dose of $8\times10^{14}$ cm$^{-2}$. In FIG. 3, Hall effect measurements are shown at room temperature on as prepared films without implantation, films after implantation without an annealing step (as implanted), and films with implantation and after an annealing step. Anneals were performed at 300° C. for 10 minutes in a rapid thermal annealing furnace under 0.5 standard liters per minute inert Ar gas flow. It was important to mitigate the loss of Se during implantation and subsequent anneals and so a blanket 100 nm encapsulation layer of Al$_2$O$_3$ was sputter deposited on Bi$_2$Se$_3$ films for this purpose before implantation. The corners of the film were masked during Al$_2$O$_3$ deposition in order to make electrical contacts. The Hall resistivity ($\rho$YX) of the as prepared film was linear over a magnetic field (H) range of −5 to 5 Tesla and has a negative slope with increasing H. The as prepared sample is clearly n-type, consistent with previous reports. The as implanted sample is also n-type by the same definition. The smaller slope of $\rho$YX versus H, while maintaining linearity, for the as implanted sample suggests a higher carrier concentration, likely due to the introduction of ion beam induced Se vacancies, which act as double donors. However, an annealing step performed on the same sample yields p-type behavior, corresponding to a positive slope of $\rho$YX versus H. In order to remove any ambiguity about the sign of majority carriers in this sample, the room temperature Seebeck coefficient for was measured for the annealed sample, which confirmed p-type behavior, shown as a positive slope in a plot of $\Delta V$ versus $\Delta T$, shown in the inset of FIG. 3. The Seebeck coefficient of films before implantation was clearly negative. As an additional control, as prepared films with an Al$_2$O$_3$ layer were annealed and no type conversion was observed. There is only a single other report of p-type conduction in MBE-grown, Ca doped Bi$_2$Se$_3$ films. See Liang He et al., *physica status solidi (RRL)—Rapid Research Letters* 7(1-2), 50 (2013).

Figure 4A:
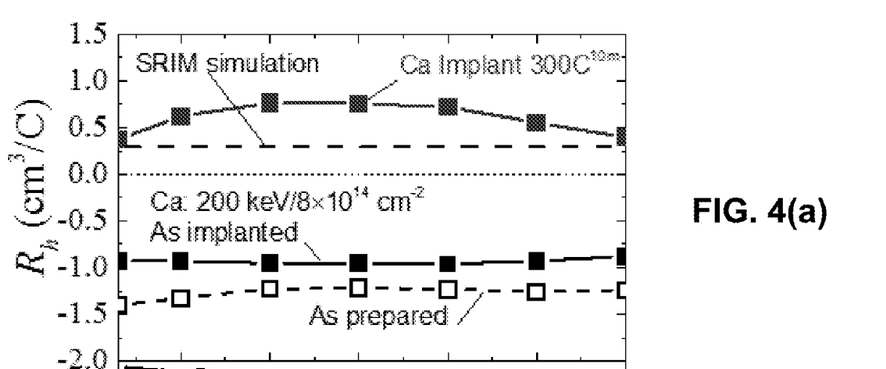
FIG. 4(a) is a graph of Hall number ($R_h$) as a function of temperature for the as prepared $Bi_2Se_3$ film (open squares), the as-implanted film (dark squares), and the annealed film (light squares) shown in FIG. 3. $R_h$ is positive for the annealed film over the entire temperature range measured. The expected carrier concentration was estimated from SRIM simulations (dashed horizontal line) assuming one hole generated per Ca dopant into intrinsic $Bi_2Se_3$, and agrees within an order of magnitude with the experimental Hall effect measurements.

Hall effect and resistivity measurements were repeated as a function of temperature down to 15 K, as shown in FIG. 4(a). The Hall coefficient ($R_h$) was computed based on the low magnetic field slope of $\rho$YX versus H. The annealed sample was p-type over the entire range measured, further confirming the p-type nature of majority carriers. In comparison, the as prepared and as implanted samples were uniformly n-type. Using SRIM simulations, the concentration of Ca ions within the film was estimated to be $\sim2\times10^{19}$ cm$^{-3}$, corresponding to an $R_h$ of $\sim0.28$ cm$^3$/C assuming that Ca ions contribute one hole per ion. At 100 K, where $R_h$ is nearly temperature independent, a value of $\sim0.75$ cm$^3$/C is observed, corresponding to a carrier concentration of $8\times10^{18}$ cm$^{-3}$, for the annealed sample. The presence of double charged Se vacancies could explain the lower carrier concentration in comparison to the SRIM estimate, which only yields the distribution of Ca.

Figure 4B:
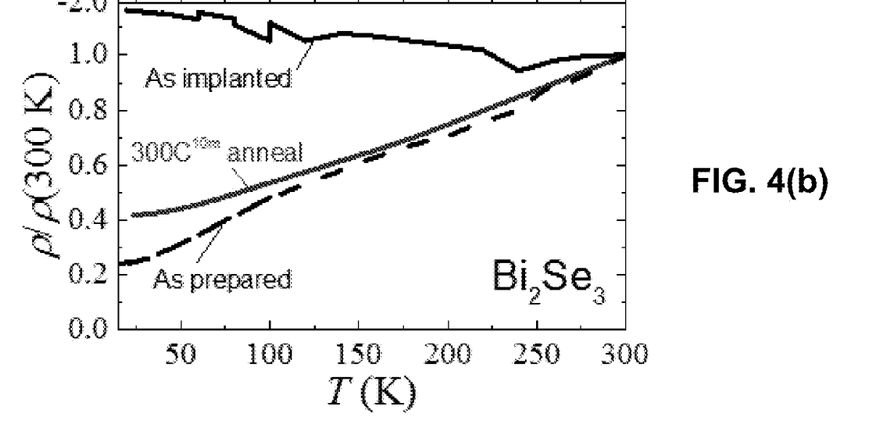
FIG. 4(b) is a graph of longitudinal resistivity ($\rho$) as a function of temperature and normalized to the room temperature value for the as prepared film (dashed line), the as implanted film (dark line), and the annealed, implanted film (light line) shown in FIG. 3. The annealed, implanted film has a temperature dependence similar to the as prepared, highly crystalline film, indicating a lower of degree of damage.

Finally, the resistivity, measured using the Van der Pauw method and normalized to the room temperature value, for the as prepared, as implanted, and annealed samples is shown in FIG. 4(b). The positive temperature coefficient of the resistivity for the as prepared film is consistent with the high crystallinity of MBE films. The resistivity of the as implanted film is weakly temperature dependent, and has a slightly negative temperature coefficient. The relatively high carrier concentration of the as implanted film suggests that this temperature dependence is likely the result of damage from the ion beam. Upon annealing, the temperature dependence nearly returns to that of the as prepared sample, suggesting the crystalline nature of the p-type film. This conclusion is also supported by the previous microstructural studies in FIGS. 1 and 2, which show the highly crystalline nature of implanted material after an annealing step. Thus, the annealing step electrically activates p-type Ca dopants and heals any structural damage associated with ion implantation.

Ca implantation doses an order of magnitude higher and lower than $\sim8\times10^{14}$ cm$^{-2}$ did not result in p-type conduction under the present experimental conditions. There is clearly a balance between the generation of n-type Se vacancies and the incorporation of p-type Ca dopants during implantation. This balance is probably a complicated function of dose, energy, annealing conditions, and encapsulation methods. However, the feasibility of ion implantation has been shown through two metrics: (1) the characterization of ion beam induced damage at different length scales, and (2) type conversion for a particular dose. Ion implantation can be used for compensation doping of Bi$_2$Se$_3$ and any of the chalcogenide topological insulator materials due to their chemical similarity. Inhomogeneously doped device structures can be fabricated in topological insulators using a combination of lithography and ion implantation. If type conversion can be achieved, planar p-n junctions can be formed. The existence of a p-n junction implies a space charge region in which there is no bulk conduction. This is an alternative method for reducing bulk conduction in topological insulators. Ion implantation has been used to fabricate integrated circuits for these reasons. See J. S. Williams, *Materials Science and Engineering*: A 253 (1-2), 8 (1998). Advanced integrated devices based on topological insulators are thus possible using ion implantation.

Figure 5:
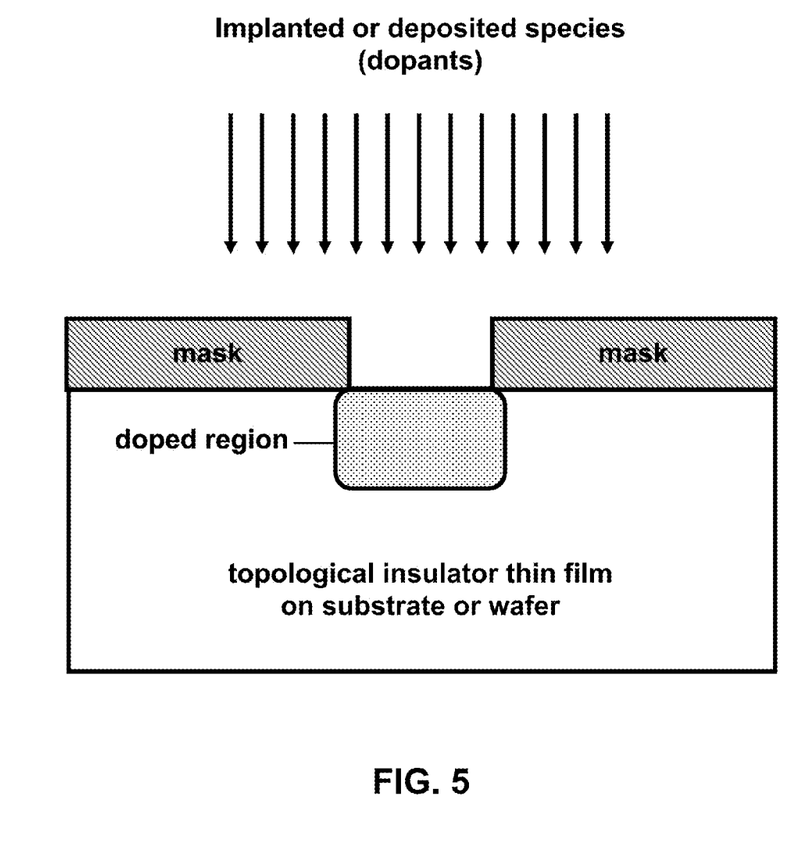
FIG. 5 is a schematic illustration of inhomogeneous doping of a topological insulator using ion implantation through a shadow mask photoresist.

FIG. 5 is a schematic illustration of inhomogeneous doping of a topological insulator using ion implantation through a shadow mask photoresist.

Figure 6:
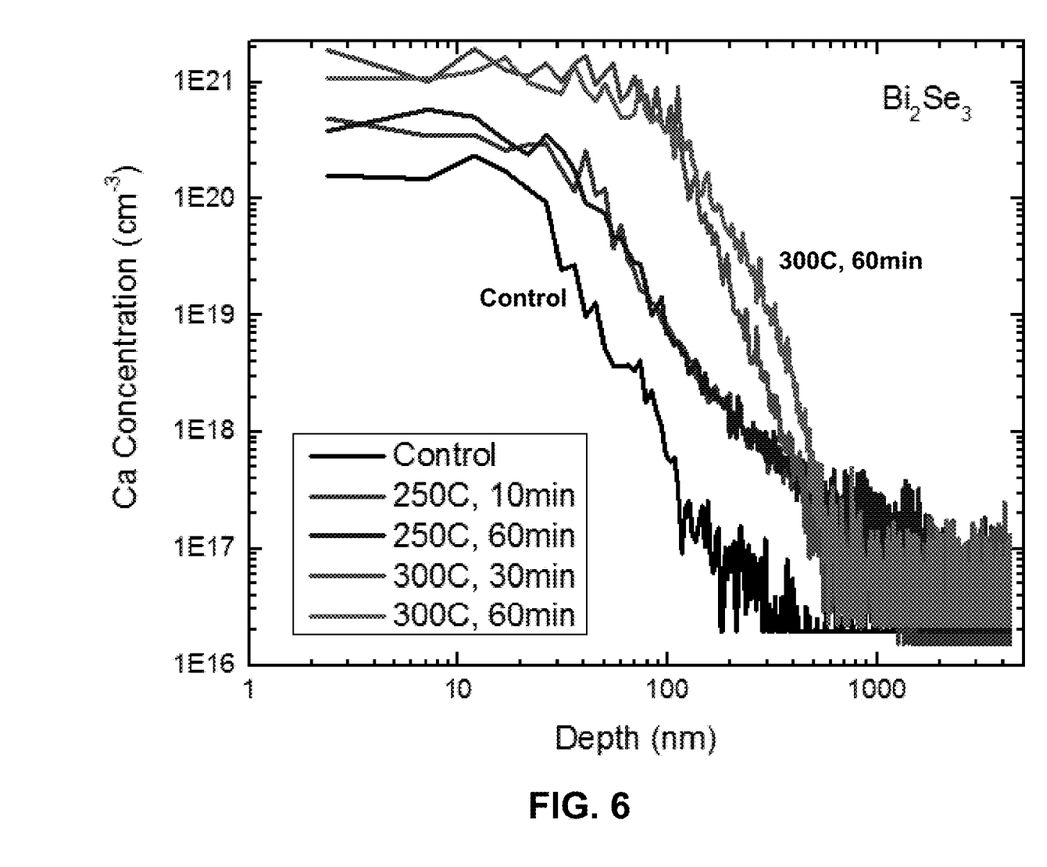
FIG. 6 is a graph of the secondary ion mass spectrometry measurements of a dopant film (calcium) on a topological insulator (bismuth selenide).

FIG. 6 is a graph of the secondary ion mass spectrometry measurements of a dopant film (here calcium) on a topological insulator (here bismuth selenide). This measurement probes the dopant concentration as a function of depth into the topological insulator. The concentration of dopants increases as the annealing temperature is increased.

Figure 7:
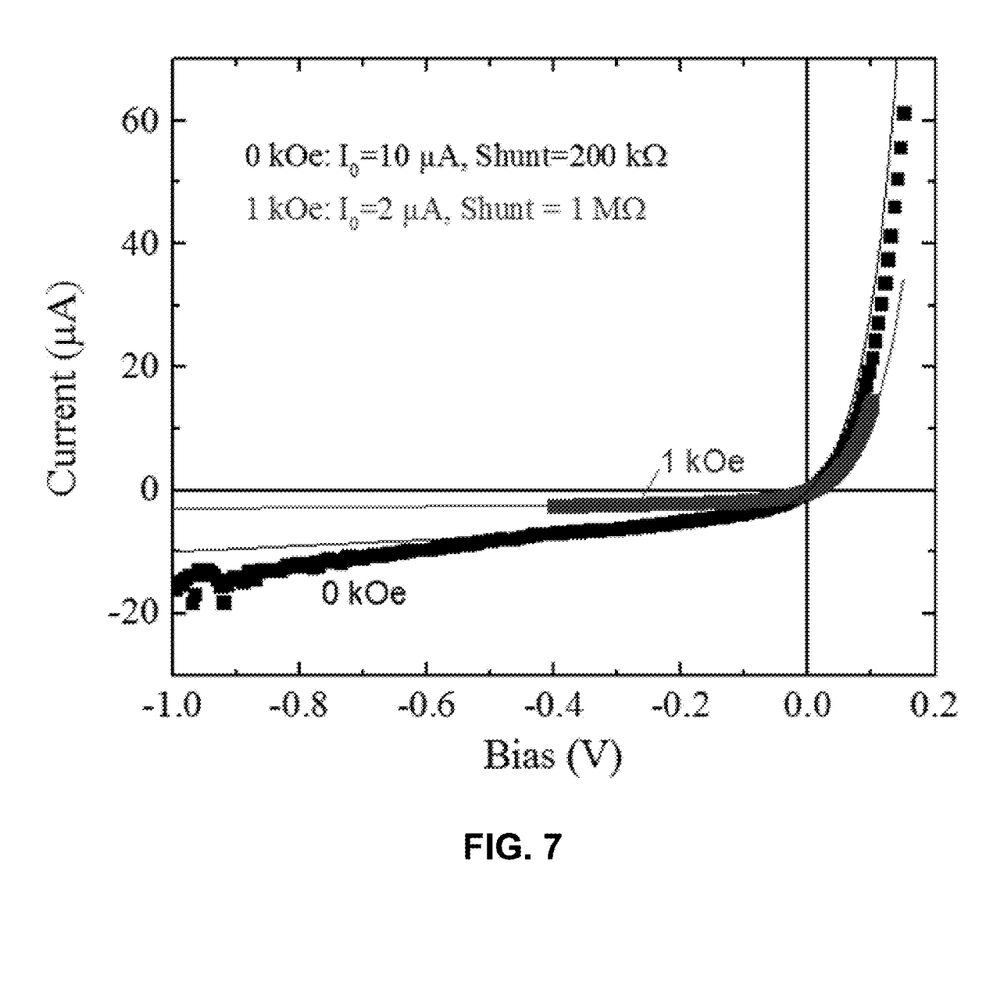
FIG. 7 is a graph of the current versus voltage of a topological insulator with a small p region embedded in the surface, formed through the deposition of p-type dopants.

FIG. 7 is a graph of the current versus voltage of a topological insulator with a small p region embedded in the surface, formed through the deposition of p-type dopants. Measurements were taken at two different magnetic fields. The increase in shunt resistance suggests surface state conduction at zero field, since surface state conduction is notionally eliminated in a magnetic field.

The present invention has been described as a method for modification of electrical properties of topological insulators. It will be understood that the above description is merely illustrative of the applications of the principles of the present invention, the scope of which is to be determined by the claims viewed in light of the specification. Other variants and modifications of the invention will be apparent to those of skill in the art.

I claim:

1. A method to modify the electrical properties of a topological insulator, comprising:
   providing a topological insulator having finite bulk conductivity due to bulk charge carriers; and
   ion implanting the topological insulator with a dopant that compensates for the bulk charge carriers.

2. The method of claim 1, wherein the bulk charge carriers comprise n-type charge carriers and the dopant comprises a p-type dopant.

3. The method of claim 2, wherein the topological insulator comprises $Bi_2Se_3$ and the p-type dopant comprises Ca.

4. The method of claim 1, wherein the bulk charge carriers comprise p-type charge carriers and the dopant comprises an n-type dopant.

5. The method of claim 1, wherein the topological insulator comprises a semimetal.

6. The method of claim 5, wherein the semimetal comprises bismuth, antimony, lead, tin, germanium, or thallium.

7. The method of claim 5, wherein the topological insulator comprises semimetal chalcogenide.

8. The method of claim 7, wherein the semimetal chalcogenide comprises selenium, tellurium, or sulfur.

9. The method of claim 1, wherein the topological insulator comprises bismuth selenide, bismuth telluride, antimony telluride, or bismuth antimony tellurium selenide.

10. The method of claim 1, wherein the ion implantation dose is greater than $5\times10^{13}$ $cm^{-2}$ and less than $10^{20}$ $cm^{-2}$.

11. The method of claim 1, further comprising annealing the ion-implanted topological insulator.

12. The method of claim 1, wherein the topological insulator is inhomogeneously doped.

* * * * *